United States Patent
Muramatsu et al.

(10) Patent No.: US 12,230,527 B2
(45) Date of Patent: Feb. 18, 2025

(54) ELECTROSTATIC CHUCK AND SUBSTRATE FIXING DEVICE

(71) Applicant: SHINKO ELECTRIC INDUSTRIES CO., LTD., Nagano (JP)

(72) Inventors: Yusuke Muramatsu, Nagano (JP); Keiichi Takemoto, Nagano (JP); Yoichi Harayama, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 242 days.

(21) Appl. No.: 17/701,769

(22) Filed: Mar. 23, 2022

(65) Prior Publication Data
US 2022/0310434 A1    Sep. 29, 2022

(30) Foreign Application Priority Data
Mar. 24, 2021 (JP) ................................. 2021-050503

(51) Int. Cl.
*H01L 21/683* (2006.01)
*H01L 21/67* (2006.01)

(52) U.S. Cl.
CPC .... *H01L 21/6833* (2013.01); *H01L 21/67103* (2013.01)

(58) Field of Classification Search
CPC ........... H01L 21/6833; H01L 21/67103; H01L 21/67109; H01L 21/68757; H01L 21/67248; H05B 3/283
USPC ....................................................... 361/234
See application file for complete search history.

(56) References Cited

U.S. PATENT DOCUMENTS

| | | | |
|---|---|---|---|
| 5,646,814 A * | 7/1997 | Shamouilian | H01L 21/6875 361/234 |
| 2005/0215073 A1 | 9/2005 | Nakamura et al. | |
| 2017/0280509 A1* | 9/2017 | Takebayashi | H05B 3/286 |
| 2018/0286732 A1* | 10/2018 | Uefuji | H01L 21/6831 |
| 2020/0035469 A1* | 1/2020 | Momiyama | H01L 21/68757 |
| 2020/0176282 A1 | 6/2020 | Ijima et al. | |
| 2020/0266088 A1* | 8/2020 | Kosakai | H01L 21/76826 |
| 2021/0335644 A1* | 10/2021 | Minemura | H01L 23/49866 |

FOREIGN PATENT DOCUMENTS

| | | | |
|---|---|---|---|
| EP | 1030364 A2 * | 8/2000 | ............ B01J 20/103 |
| JP | 2000-268942 A | 9/2000 | |
| JP | 2005-277074 A | 10/2005 | |

(Continued)

OTHER PUBLICATIONS

Japanese Office Action dated Nov. 5, 2024 issued in corresponding Japanese application No. 2021-050503; English translation included (6 pages).

*Primary Examiner* — Thienvu V Tran
*Assistant Examiner* — Sreeya Sreevatsa
(74) *Attorney, Agent, or Firm* — Rankin, Hill & Clark LLP

(57) ABSTRACT

An electrostatic chuck includes: a base body having: a mounting face on which an object to be adsorbed is to be mounted; and a back face that is opposite to the mounting face; an insulating layer that is formed on the back face; a heating element that is built in the insulating layer and configured to generate heat; and at least one thermal diffusion layer that is built in the base body and configured to diffuse the heat generated by the heating element. The at least one thermal diffusion layer is formed of a material higher in thermal conductivity than the base body.

14 Claims, 6 Drawing Sheets

(56) References Cited

FOREIGN PATENT DOCUMENTS

| | | | |
|---|---|---|---|
| JP | 2020-088304 A | | 6/2020 |
| KR | 20120046540 A | * | 5/2012 |
| KR | 20130104738 A | * | 9/2013 |

* cited by examiner

ELECTROSTATIC CHUCK AND SUBSTRATE FIXING DEVICE

This application claims priority from Japanese Patent Applications No. 2021-050503, filed on Mar. 24, 2021, the entire contents of which are herein incorporated by reference.

BACKGROUND

Technical Field

The present disclosure relates to an electrostatic chuck and a substrate fixing device.

Background Art

In the background art, film forming apparatuses (such as CVD apparatuses and PVD apparatuses) and plasma etching apparatuses used for manufacturing semiconductor devices such as ICs and LSIs have stages for accurately holding wafers in vacuum processing chambers.

As such a stage, for example, there has been proposed a substrate fixing device in which an electrostatic chuck mounted on a base plate is used to adsorb and hold a wafer, that is an object to be adsorbed. The electrostatic chuck is, for example, provided with a heating element, and a metal layer that makes heat from the heating element uniform (see e.g., JP-A-2020-88304).

However, in recent years, a further improvement in heat uniformity in the electrostatic chuck has been required, and it has been difficult to satisfy the requirement for the improvement in the heat uniformity with the background-art structure.

SUMMARY

Certain embodiment provides an electrostatic chuck. The electrostatic chuck comprises: a base body comprising: a mounting face on which an object to be adsorbed is to be mounted; and a back face that is opposite to the mounting face; an insulating layer that is formed on the back face; a heating element that is built in the insulating layer and configured to generate heat; and at least one thermal diffusion layer that is built in the base body and configured to diffuse the heat generated by the heating element. The at least one thermal diffusion layer is formed of a material higher in thermal conductivity than the base body.

Certain embodiment provides a substrate fixing device. The substrate fixing device comprises: a base plate; and the electrostatic chuck that is mounted on one face of the base plate.

DETAILED DESCRIPTION OF EMBODIMENT

A mode for carrying out the disclosure will be described below with reference to the drawings. Incidentally, in each of the drawings, the same reference signs will be given to the same constituent portions, and redundant explanations thereof may be omitted.

Structure of Substrate Fixing Device

Figure 1:
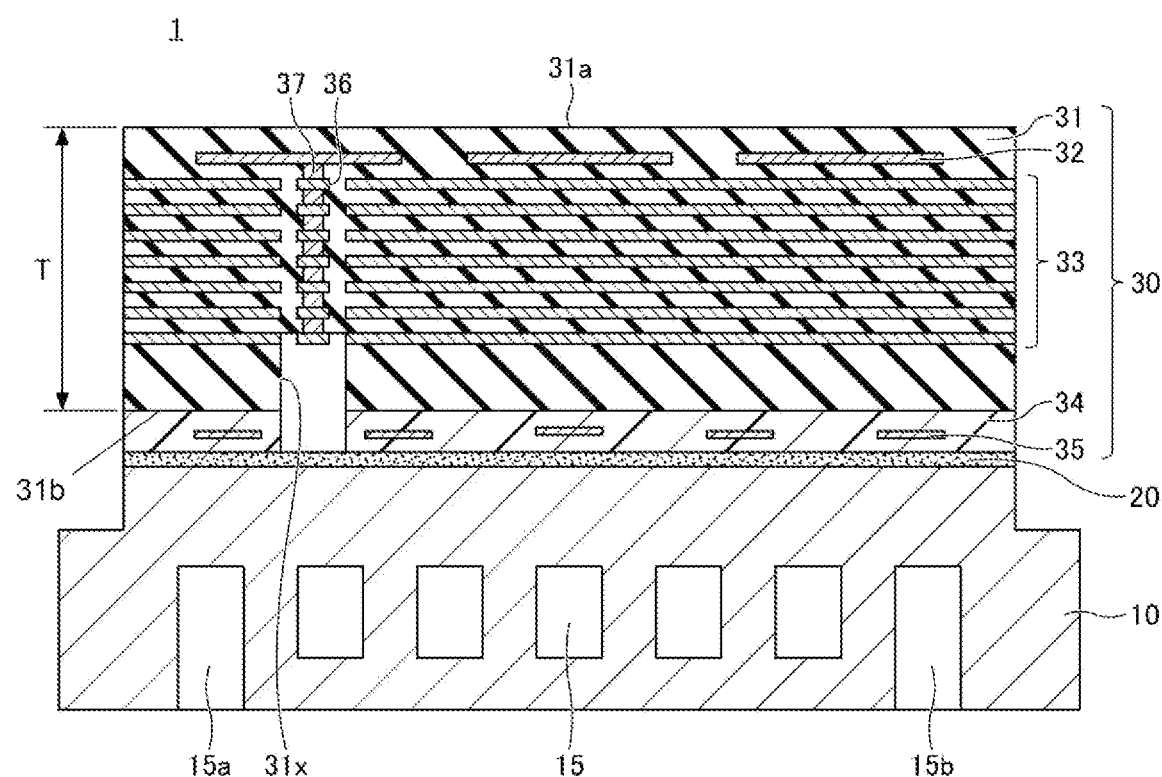
FIG. 1 is a sectional view illustrating a substrate fixing device according to a first embodiment in a simplified manner.

FIG. 1 is a sectional view illustrating a substrate fixing device according to a first embodiment in a simplified manner. With reference to FIG. 1, the substrate fixing device 1 has a base plate 10, an adhesive layer 20, and an electrostatic chuck 30 as major constituent elements.

The base plate 10 is a member for mounting the electrostatic chuck 30 thereon. Thickness of the base plate 10 can be, for example, set in a range of about 20 mm to 50 mm. The base plate 10 is, for example, formed of aluminum, and can be also used as an electrode or the like for controlling plasma. Predetermined high-frequency electric power is fed to the base plate 10 to control energy for making generated ions or the like in a plasma state collide against a wafer adsorbed on the electrostatic chuck 30 so that an etching process can be effectively performed on the wafer.

A water channel 15 is provided inside the base plate 10. The water channel 15 has one end where a cooling water introduction portion 15a is provided, and the other end where a cooling water discharge portion 15b is provided. The water channel 15 is connected to a cooling water control device (not shown) provided outside the substrate fixing device 1. The cooling water control device (not shown) introduces cooling water into the water channel 15 from the cooling water introduction portion 15a and discharges the cooling water from the cooling water discharge portion 15b. When the base plate 10 is cooled by the cooling water circulated in the water channel 15, the wafer adsorbed on the electrostatic chuck 30 can be cooled. In addition to the water channel 15, a gas channel or the like for introducing inert gas to cool the wafer adsorbed on the electrostatic chuck 30 may be provided in the base plate 10.

The electrostatic chuck 30 is configured to adsorb and hold the wafer, which is an object to be adsorbed. The electrostatic chuck 30 can be, for example, shaped like a circle in plan view. The diameter of the wafer, which is the object to be adsorbed by the electrostatic chuck 30, can be, for example, set at about 8, 12, or 18 inches.

The electrostatic chuck 30 is mounted on one face of the base plate 10 through the adhesive layer 20. For example, a silicone-based adhesive agent can be used as the adhesive layer 20. Thickness of the adhesive layer 20 can be, for example, set at about 2 mm. Thermal conductivity of the adhesive layer 20 is preferably set at 2 W/m·K or higher. The adhesive layer 20 may be formed into a laminate structure in which adhesive layers are disposed on one another. For example, the adhesive layer 20 is formed into a two-layer structure in which an adhesive agent with high thermal conductivity and an adhesive agent with a low elastic modulus are combined, so that it is possible to obtain an effect of reducing stress caused by a difference in thermal expansion between the base plate made of aluminum and the adhesive layer 20.

The electrostatic chuck 30 has a base body 31, an electrostatic electrode 32, at least one thermal diffusion layer 33, an insulating layer 34, and a heating element 35. The electrostatic chuck 30 is, for example, a Johnsen-Rahbek type electrostatic chuck. However, the electrostatic chuck 30 may be a Coulomb force type electrostatic chuck.

The base body 31 that is a dielectric substance has a mounting face 31a on which the object to be adsorbed can be mounted. For example, ceramics such as aluminum oxide ($Al_2O_3$) and aluminum nitride (AlN) can be used as the base body 31. Thickness T of the base body 31 can be, for example, set in a range of about 4 mm to 10 mm, and a relative dielectric constant (at 1 kHz) of the base body 31 can be, for example, set in a range of about 9 to 10.

The electrostatic electrode 32 that is a thin-film electrode is built into the base body 31. The electrostatic electrode 32 is electrically connected to a vertical wiring built into the base body 31. The vertical wiring includes pads 36 and vias 37 that are disposed on each other alternately. The vertical wiring is provided so as to extend along the thickness direction of the base body 31. One of the pads 36 positioned at a lowermost layer is exposed in a recess 31x that is opened on a back face side of the base body 31. The pad 36 positioned at the lowermost layer is connected to a power supply provided outside the substrate fixing device 1. When a predetermined voltage is applied to the pad 36 in the lowermost layer from the power supply, an adsorption force caused by static electricity is generated between the water and the electrostatic electrode 32. As a result, the wafer can be adsorbed and held on the mounting face 31a of the base body 31 of the electrostatic chuck 30. As the voltage applied to the electrostatic electrode 32 is higher, the adsorption and holding force is stronger. The electrostatic electrode 32 may be a unipolar shape or a bipolar shape. For example, tungsten, molybdenum, etc. can be used as each of materials of the electrostatic electrode 32, the pads 36, and the vias 37.

The thermal diffusion layer 33 is built into the base body 31. The thermal diffusion layer 33 is a layer by which heat generated by the heating element 35 can be made uniform and diffused. The thermal diffusion layer 33 is formed of a material higher in thermal conductivity than the base body 31. The thermal conductivity of the thermal diffusion layer 33 is preferably 400 W/m·K or higher. Examples of the material that can achieve such thermal conductivity include metals such as copper (Cu), a copper alloy, silver (Ag), a silver alloy, tungsten, and molybdenum, carbon nanotube, and the like. Thickness of the thermal diffusion layer 33 can be, for example, set in a range of about 5 μm to 20 μm.

When at least one thermal diffusion layer 33 is provided in the base body 31, it is possible to obtain an effect of uniformly diffusing the heat generated by the heating element 35 into the entire base body 31. When a plurality of thermal diffusion layers 33 are disposed in the thickness direction of the base body 31, the effect of uniformly diffusing the heat generated by the heating element 35 into the entire base body 31 is greater. From a viewpoint of improving the effect of diffusing the heat, each of the thermal diffusion layers 33 is preferably arranged all over the inside of the base body 31 in a horizontal direction (parallel direction to the mounting face 31a).

In the first embodiment, by way of example, the thermal diffusion layers 33 are respectively arranged in all the layers where the pads 36 are arranged. That is, in the thickness direction of the base body 31, the position of each of the pads 36 is the same as the position of a corresponding one of the thermal diffusion layers 33. In the example of FIG. 1, seven thermal diffusion layers 33 are disposed at predetermined intervals. Each of the intervals between the thermal diffusion layers 33 vertically adjacent to one another is, for example, 0.45 mm. The vertical wiring is built into the base body 31 so as to be spaced from the thermal diffusion layers 33. Specifically, each of the thermal diffusion layers 33 is arranged to be spaced from a corresponding one of the pads 36 so as not to electrically continue to the corresponding pad 36. Assume that the pad 36 is shaped like a circle in plan view. In this case, for example, a circular opening with a larger diameter than the pad 36 is formed in the thermal diffusion layer 33, and the pad 36 is positioned in the opening. In addition, the thermal diffusion layers 33 surround the vertical wiring in plan view.

In the first embodiment, by way of example, each of the thermal diffusion layers 33 is formed all over the inside of the base body 31 in the horizontal direction except for a pad arrangement area where the pad 36 is formed, and an entire outer circumferential face of the thermal diffusion layer 33 is exposed in an outer circumferential face of the base body 31. That is, the thermal diffusion layer 33 is formed to extend to the outermost circumference of the base body 31. Here, the pad arrangement area means an area from an outer edge of the pad 36 to 100 μm outside the outer edge.

Incidentally, in the background-art electrostatic chuck, the metal layer or the like which functions as a thermal diffusion layer is fixed to a base body through an adhesive layer or the metal layer is patterned into a predetermined shape, so that satisfactory heat uniformity cannot be achieved.

The insulating layer 34 is formed directly on the back face 31b (face located on an opposite side to the mounting face 31a) of the base body 31. The insulating layer 34 is a layer that insulates the base body 31 and the heating element 35 from each other. For example, an epoxy resin, a bismaleimide-triazine resin, or the like, having high thermal conductivity and high heat resistance can be used as the insulating layer 34. The thermal conductivity of the insulating layer 34 is preferably set at 3 W/m·K or higher. Since a filler of alumina, aluminum nitride, etc. is contained in the insulating layer 34, the thermal conductivity of the insulating layer 34 can be improved. Moreover, glass transition temperature (Tg) of the insulating layer 34 is preferably set at 250° C. or higher. Moreover, thickness of the insulating layer 34 is preferably set in a range of about 100 μm to 150 μm, and a variation in the thickness of the insulating layer 34 is preferably set in a range of ±10% or less.

The heating element 35 is built into the insulating layer 34. The circumference of the heating element 35 is covered with the insulating layer 34 to be protected from the outside. The heating element 35 to which a voltage is applied from the outside of the substrate fixing device 1 generates heat to heat the mounting face 31a of the base body 31 to a predetermined temperature. The heating element 35 can, for example, heat the temperature of the mounting face 31a of the base body 31 to about 250° C. to 300° C. For example, copper (Cu), tungsten (W), nickel (Ni), constantan (an alloy of Cu/Ni/Mn/Fe), etc. can be used as the material of the heating element 35. Thickness of the heating element 35 can be, for example, set in a range of about 20 μm to 100 μm. The heating element 35 can be, for example, set to have a concentric pattern.

Incidentally, in order to improve tight adhesiveness between the heating element 35 and the insulating layer 34 under high temperature, at least one face (one or each of upper and lower faces) of the heating element 35 is preferably roughened. Both the upper and lower faces of the heating element 35 may be roughened. In this case, different roughening methods may be used on the upper and lower faces of the heating element 35. The roughening methods are not limited particularly, but may include a method based on etching, a method using coupling agent-based surface modification technology, a method using dot processing by a UV-YAG laser with a wavelength of 355 nm or less, etc.

Method for Manufacturing Substrate Fixing Device

FIGS. 2A to 4B are views illustrating a process of manufacturing the substrate fixing device according to the first embodiment. The process of manufacturing the substrate fixing device 1 will be centered around a process of forming the electrostatic chuck and described with reference to FIGS. 2A to 4B. Incidentally, FIGS. 2A to 4A are drawn in a vertically inverted state to FIG. 1.

Figure 2A:
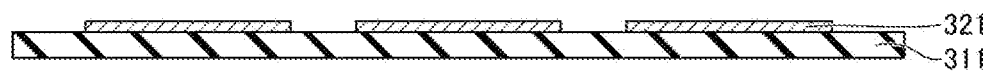
FIGS. 2A to 2D are views illustrating a process of manufacturing the substrate fixing device according to the first embodiment (Part 1)

First, in a step shown in FIG. 2A, a green sheet 311 is prepared. In a case where, for example, ceramics forming a base body 31 is aluminum oxide, a material forming the green sheet 311 includes particles of aluminum oxide. The material forming the green sheet 311 may include a binder, a solvent etc. The green sheet 311 is, for example, 0.58 mm to 0.62 mm thick (changes to be about 0.45 mm thick after firing). Next, a metal paste 321 is printed with a predetermined pattern on one face of the green sheet 311. The metal paste 321 is a material that will be turned to an electrostatic electrode 32 by firing. The metal paste 321 is, for example, a tungsten paste or a molybdenum paste.

Figure 2B:
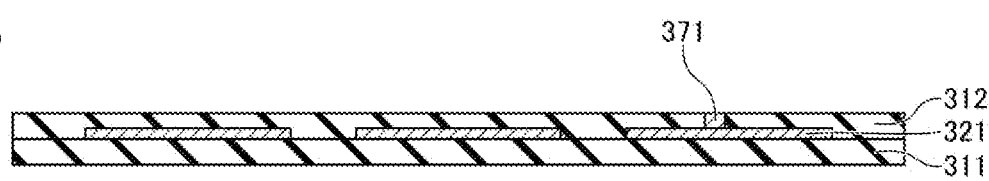

Next, in a step shown in FIG. 2B, a green sheet 312 covering the metal paste 321 is provided on the face of the green sheet 311. The size and the material of the green sheet 312 are similar to or the same as those of the green sheet 311. Next, via processing is performed on the green sheet 312, and a via obtained thus is filled with a metal paste 371. The metal paste 371 is a material that will be turned to a via 37 by firing. The metal paste 371 is, for example, a tungsten paste or a molybdenum paste.

Figure 2C:
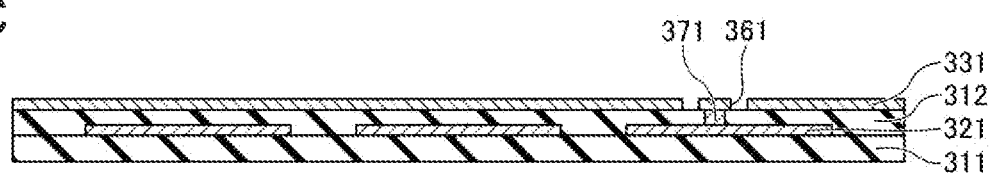

Next, in a step shown in FIG. 2C, metal pastes 331 and 361 are printed on one face of the green sheet 312 with predetermined patterns. The metal paste 331 is a material that will be turned to a thermal diffusion layer 33 by firing. The metal paste 361 is a material that will be turned to a pad 36 by firing. The metal pastes 331 and 361 are, for example, a tungsten paste or a molybdenum paste. The metal pastes 331 and 361 may be different materials.

Figure 2D:
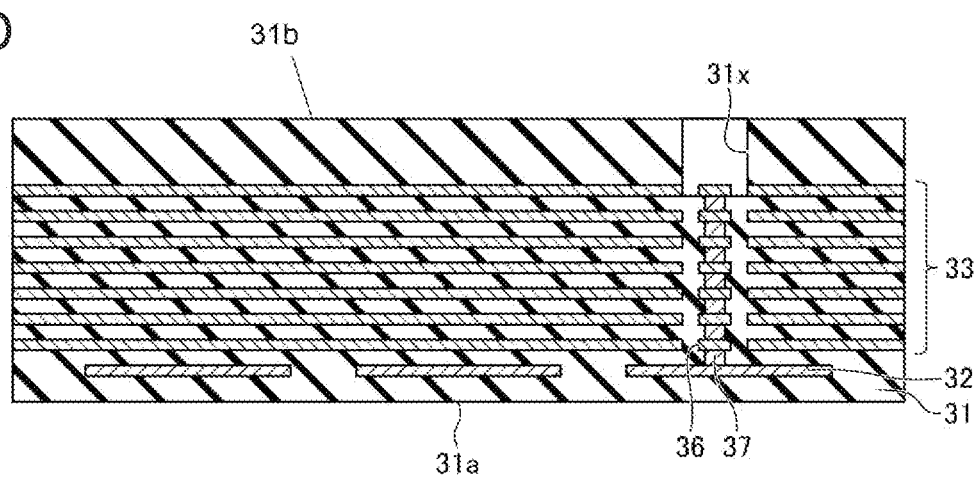

Next, in a step shown in FIG. 2D, the steps of FIG. 2B and FIG. 2C are repeated a required number of times so that the required number of green sheets can be then further provided. For example, assume that each of the green sheets is 0.58 mm to 0.62 mm thick. In this case, one layer of the metal paste 331, that will be turned to a thermal diffusion layer 33, can be formed every increase of 0.58 mm to 0.62 mm in thickness. Next, after surface polishing etc. performed if occasions demand, the green sheets are integrated by firing so as to form a base body 31. Moreover, by firing, the electrostatic electrode 32, the thermal diffusion layers 33, the pads 36, and the vias 37 are formed from the respective metal pastes. After the firing, a recess 31x is formed. The recess 31x can be formed, for example, by blasting, drilling, or the like. Incidentally, in a case where there is another groove or hole such as a gas introduction portion, processing is also performed in a similar manner or the same manner.

Figure 3A:
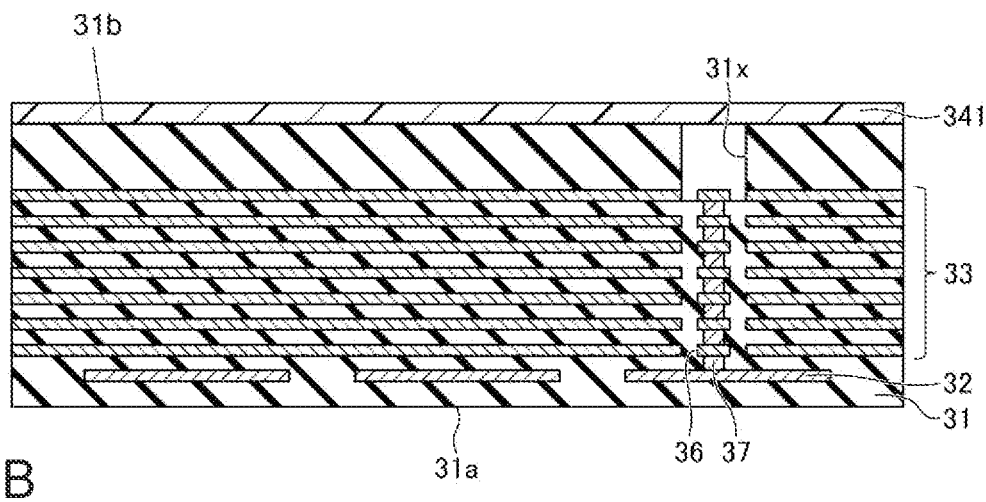
FIGS. 3A to 3C are views illustrating the process of manufacturing the substrate fixing device according to the first embodiment (Part 2)

Next, in a step shown in FIG. 3A, an insulating resin film 341 is directly arranged on an opposite face (upper face in FIG. 3A) of the base body 31 to a mounting face 31a. Lamination of the insulating resin film 341 in a vacuum is suitable for making it possible to prevent entrapment of voids. The insulating resin film 341 is not cured but is left in a semi-cured state (B-stage) in advance. The insulating resin film 341 is temporarily fixed on the base body 31 by adhesive force of the insulating resin film 341 that is in the semi-cured state.

For example, an epoxy resin, a bismaleimide-triazine resin, or the like, which has high thermal conductivity and high heat resistance, can be used as the insulating resin film 341. The thermal conductivity of the insulating resin film 341 is preferably set at 3 W/m·K or higher. Due to a filler of alumina, aluminum nitride, etc. contained in the insulating resin film 341, the thermal conductivity of the insulating resin film 341 can be improved. Moreover, glass transition temperature of the insulating resin film 341 is preferably set at 250° C. or higher. Moreover, from a viewpoint of enhancing thermal conduction performance (increasing thermal conduction speed), thickness of the insulating resin film 341 is preferably set at 60 µm or less. A variation in the thickness of the insulating resin film 341 is preferably set in a range of ±10% or less.

Figure 3B:
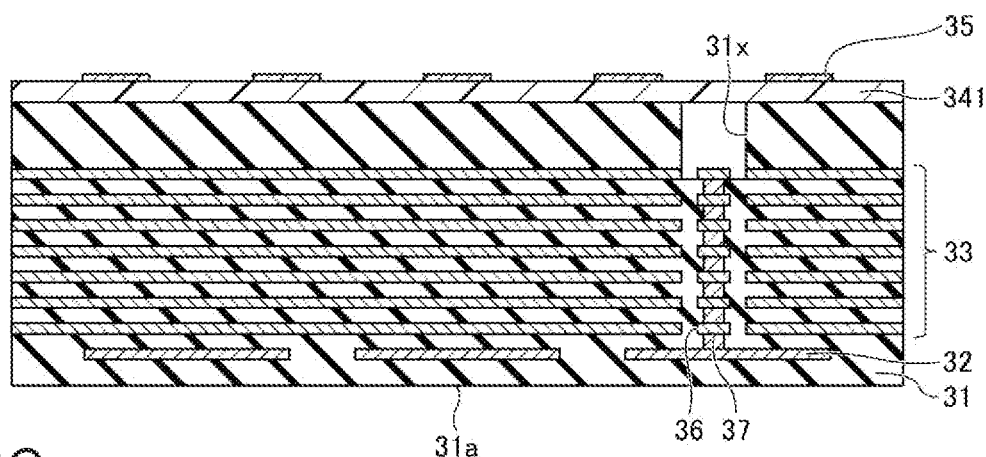

Next, in a step shown in FIG. 3B, a metal foil is arranged on the insulating resin film 341, and the metal foil is patterned to form a heating element 35. The heating element 35 can be, for example, set to have a concentric circular pattern. Specifically, for example, a resist is formed on the entire metal foil, and the resist is exposed to light and developed so that a resist pattern that covers only a portion that will be left as the heating element 35 is formed. Next, a portion of the metal foil that is not covered with the resist pattern is removed by etching. Assume that, for example, the material of the metal foil is copper. In this case, a cupric chloride etching solution, a ferric chloride etching solution, or the like, can be used as an etching solution for removing the metal foil.

Then, the resist pattern is stripped by a stripping solution so that the heating element 35 is formed at a predetermined position on the insulating resin film 341 (photolithography method). Due to the formation of the heating element 35 by the photolithography method, a variation in a widthwise dimension of the heating element 35 can be reduced so that a heat generation distribution can be improved. Incidentally, the heating element 35 formed by etching can be, for example, formed into an approximately trapezoidal shape in section. In this case, a difference in wiring width between a face contacting the insulating resin film 341 and an opposite face thereto can be, for example, set in a range of about 10 µm to 50 µm. The heating element 35 is formed into the simple approximately trapezoidal shape in section, so that the heat generation distribution can be improved.

Figure 3C:
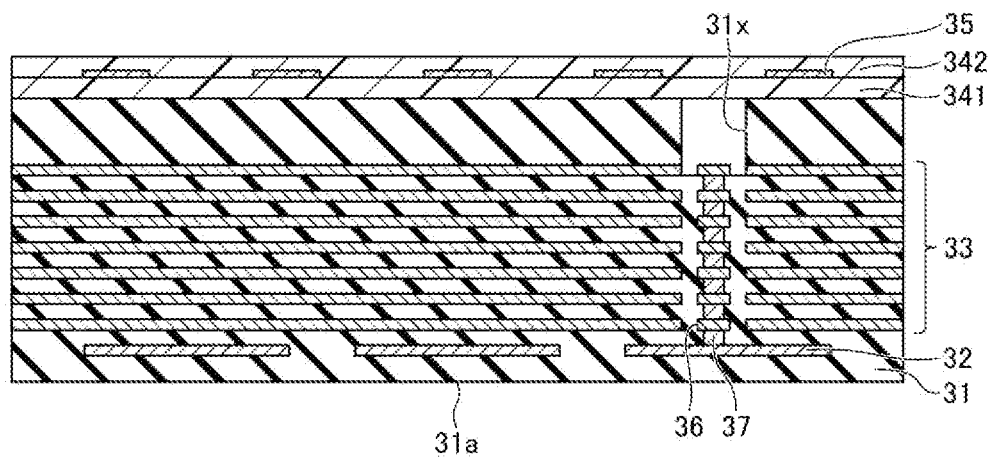

Next, in a step shown in FIG. 3C, an insulating resin film 342 covering the heating element 35 is arranged on the insulating resin film 341. Lamination of the insulating resin film 342 in a vacuum is suitable for making it possible to prevent entrapment of voids. The material of the insulating resin film 342 can be, for example, set to be similar to or the same as that of the insulating resin film 341. However, thickness of the insulating resin film 342 can be appropriately determined as long as the insulating resin film 342 can cover the heating element 35. The insulating resin film 342 does not have to be the same in thickness as the insulating resin film 341.

Figure 4A:
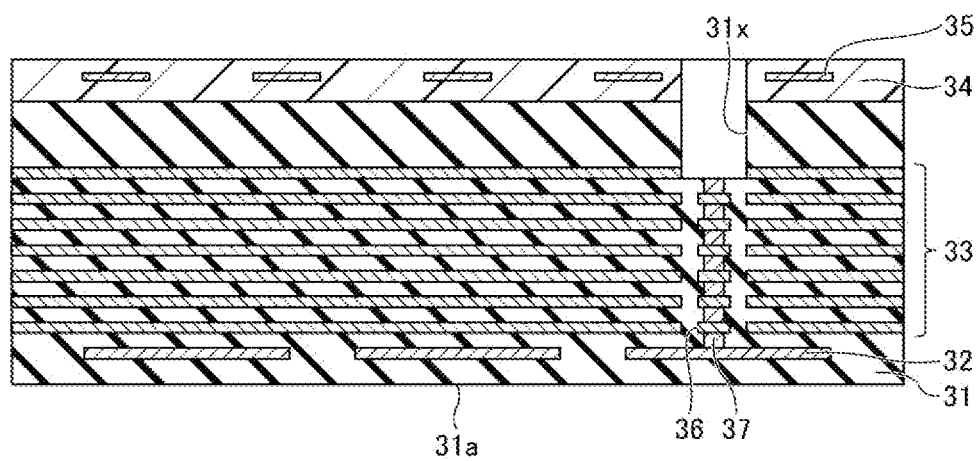
FIGS. 4A and 4B are views illustrating the process of manufacturing the substrate fixing device according to the first embodiment (Part 3)

Next, in a step shown in FIG. 4A, the insulating resin films 341 and 342 are cured by heating at a curing temperature or higher while being pressed against the base body 31. Thus, the insulating resin films 341 and 342 are integrated into an insulating layer 34. As a result, the insulating layer 34 directly bonded to the thermal diffusion layers 33 is formed. In addition, the circumference of the heating element 35 is covered with the insulating layer 34. Next, a through hole is formed in the insulating layer 34 to communicate with the recess 31x. Incidentally, the heating temperature of the insulating resin films 341 and 342 is preferably set at 200° C. or lower in consideration of stress that is generated when the temperature returns to normal temperature. In the aforementioned manner, the electrostatic chuck 30 is completed.

Incidentally, the insulating resin films 341 and 342 are cured by heating while being pressed against the base body 31, so that roughness of an upper face (face not contacting the electrostatic chuck 30) of the insulating layer 34 affected by the presence/absence of the heating element 35 can be reduced so as to be made flat. The roughness of the upper face of the insulating layer 34 is preferably set at 7 μm or less. When the roughness of the upper face of the insulating layer 34 is set at 7 μm or less, voids can be prevented from being entrapped between the insulating layer 34 and an adhesive layer 20 in a next step. That is, adhesiveness between the insulating layer 34 and the adhesive layer 20 can be prevented from deteriorating.

Figure 4B:
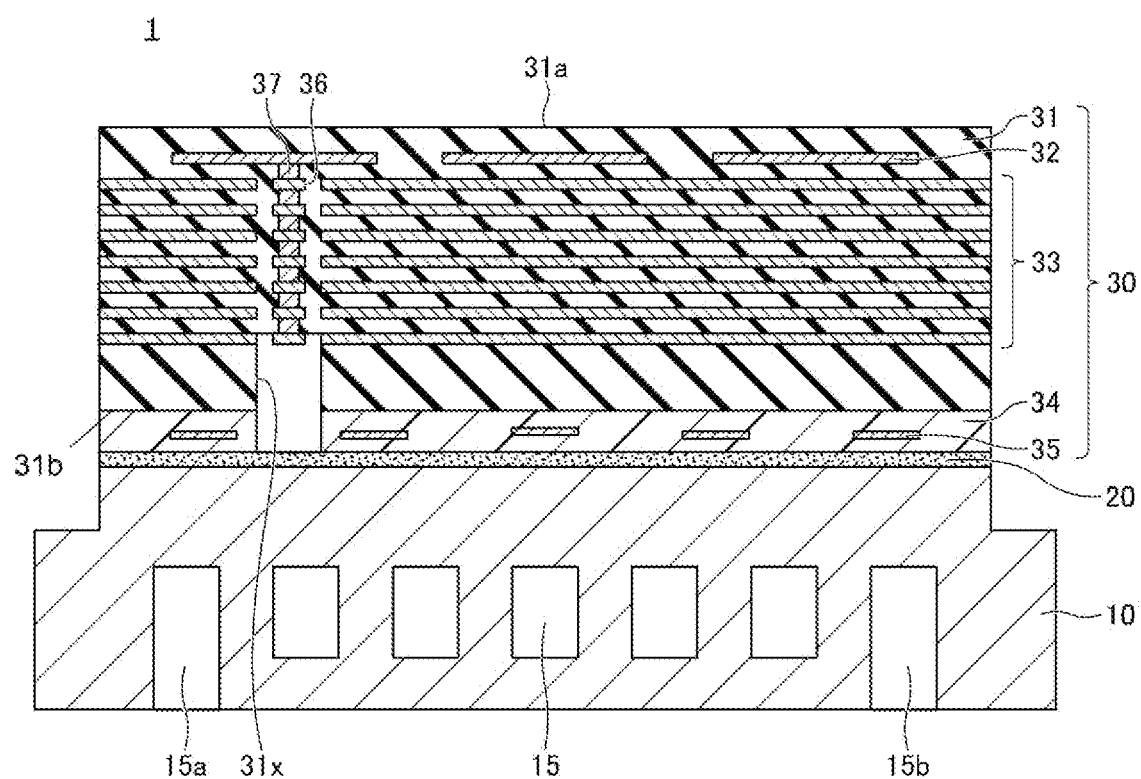

Next, in a step shown in FIG. 4B, a base plate 10 where a water channel 15 etc. has been formed is prepared, and the adhesive layer 20 (uncured) is formed on the base plate 10. The electrostatic chuck 30 shown in FIG. 4A is vertically inverted and arranged on the base plate 10 through the adhesive layer 20, and the adhesive layer 20 is cured. Thus, the substrate fixing device 1 in which the electrostatic chuck 30 is disposed on the base plate 10 through the adhesive layer 20 is completed.

Thus, in the electrostatic chuck 30, the thermal diffusion layers 33 are built in the base body 31. Accordingly, heat generated by the heating element 35 can be easily and uniformly transferred to the base body 31. That is, heat uniformity can be further improved by the electrostatic chuck 30 in comparison with a background-art structure in which a thermal diffusion layer is provided outside a base body.

In addition, since each of the thermal diffusion layers 33 is formed all over the inside of the base body 31 in the horizontal direction, the heat generated by the heating element 35 can be diffused uniformly into the entire base body 31. In addition, since the thermal conductivity of each of the thermal diffusion layers 33 is set at 400 W/m·K or higher, the heat can be quickly diffused in the base body 31 in the horizontal direction. The heat uniformly diffused by the thermal diffusion layers 33 can heat the base body 31 uniformly.

Incidentally, when a thermal diffusion distance between the heating element 35 and the mounting face 31a is short, i.e., when the thickness T of the base body 31 is small, a dimensional variation etc. of the heating element 35 easily affects the mounting face 31a. In other words, as the thickness T of the base body 31 increases, the thermal diffusion distance between the heating element 35 and the mounting face 31a increases. Therefore, a temperature distribution of the mounting face 31a is easily blurred so that the temperature distribution can be improved. With the combination of the provision of the thermal diffusion layers 33 inside the base body 31 and the increase in the thickness T of the base body 31, the temperature distribution can be improved more effectively. In the background art, the thickness T of the base body 31 is often about 4.5 mm. In order to improve the temperature distribution, the thickness T of the base body 31 is preferably set to be not smaller than 4.95 mm and not larger than about 9 mm.

Modification 1 of First Embodiment

An example in which the number of thermal diffusion layers disposed on one another is further increased will be shown in Modification 1 of the first embodiment. Incidentally, in the Modification 1 of the first embodiment, description about constituent portions which are the same as those in the aforementioned embodiment may be omitted.

Figure 5:
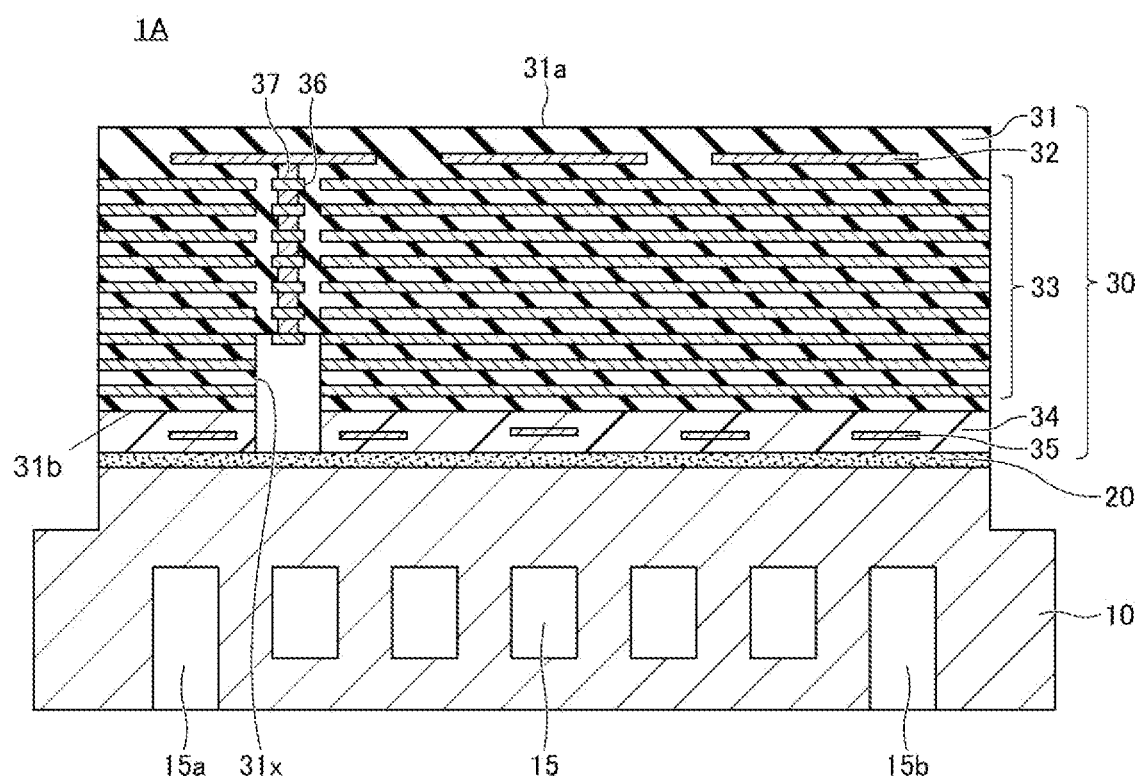
FIG. 5 is a sectional view illustrating a substrate fixing device according to Modification 1 of the first embodiment in a simplified manner.

FIG. 5 is a sectional view illustrating a substrate fixing device according the Modification 1 of the first embodiment in a simplified manner. With reference to FIG. 5, the substrate fixing device 1A differs from the substrate fixing device 1 in that some of thermal diffusion layers 33 are provided to be lower than layers where pads 36 are formed.

That is, in the substrate fixing device 1A, ones of the thermal diffusion layers 33 are arranged on a nearer side to a back face 31b of a base body 31 than one of the pads 36 that is arranged on a nearest side to the back face 31b of the base body 31. Further in other words, a distance between the pad 36 positioned at a lowermost layer and the back face 31b is longer than a distance between a lowermost thermal diffusion layer 33 and the back face 31b in a thickness direction of the base body 31. On the other hand, in the substrate fixing device 1 shown in FIG. 1, a distance between the pad 36 positioned at the lowermost layer and the back face 31b is equal to a distance between a lowermost thermal diffusion layer 33 and the back face 31b in the thickness direction of the base body 31. In addition, in the substrate fixing device 1A shown in FIG. 5, the number of the layers of the pads 36 is smaller than the number of the thermal diffusion layers 33. To provide each of the thermal diffusion layers 33 lower than the layers where the pads 36 are formed, a layer of a metal paste 331 that will be turned to the thermal diffusion layer 33 may be formed whenever a green sheet where the recess 31x is formed is additionally provided in the step of FIG. 2D.

In this manner, an area lower than the layers where the pads 36 are formed is effectively used, and the thermal diffusion layers 33 are also provided in this area. Accordingly, the number of the thermal diffusion layers 33 is further increased. Consequently, heat uniformity can be further improved.

In addition, in the substrate fixing device 1A shown in FIG. 5, a distance between an uppermost thermal diffusion layer 33 and the mounting face 31a is longer than a distance between the lowermost thermal diffusion layer 33 and the back face 31b in the thickness direction of the base body 31. On the other hand, in the substrate fixing device 1 shown in FIG. 1, a distance between an uppermost thermal diffusion layer 33 and the mounting face 31a is shorter than a distance between the lowermost thermal diffusion layer 33 and the back face 31b.

Simulation

Four types of samples shown in the following Table 1 were used to simulate a temperature distribution (heat uniformity) in a mounting face of a base body when average temperature of the mounting face of the base body was controlled to be 60° C. In Table 1, a sample Ref is a sample that includes a base body 4.5 mm thick but does not include any thermal diffusion layers, and that corresponds to a background-art electrostatic chuck. In addition, a sample A is a sample that includes a base body 6.8 mm thick but does not include any thermal diffusion layers, and that differs from the sample Ref only in the thickness of the base body. In addition, a sample B is a sample that includes a base body 6.8 mm thick and five thermal diffusion layers, and that differs from the sample A only in the presence/absence of the thermal diffusion layers. In addition, a sample C is a sample that includes a base body 6.8 mm thick and fourteen thermal diffusion layers, and that differs from the sample B only in the number of the thermal diffusion layers.

TABLE 1

| | Base Body | | Thermal Diffusion Layer | | | |
|---|---|---|---|---|---|---|
| Sample | Thickness | Outer Diameter | Material | Thickness | Number of Layers | Layer Interval |
| Ref | 4.5 mm | 295.8 mm | — | — | — | — |
| A | 6.8 mm | 295.8 mm | — | — | — | — |
| B | 6.8 mm | 295.8 mm | Tungsten | 0.01 mm | 5 | 0.45 mm |
| C | 6.8 mm | 295.8 mm | Tungsten | 0.01 mm | 14 | 0.45 mm |

Table 2 shows simulation results. In Table 2, an average value is an average value of temperature of the mounting face of the base body, Range is a difference between lowest and highest temperatures, and Sigma is a standard deviation.

TABLE 2

| | Temperature | | |
|---|---|---|---|
| Sample | Average Value | Sigma | Range |
| Ref | 60.008 | 0.275 | 2.145 |
| A | 60.002 | 0.726 | 1.437 |
| B | 60.041 | 0.224 | 1.402 |
| C | 60.041 | 0.223 | 1.359 |

Figure 6A:
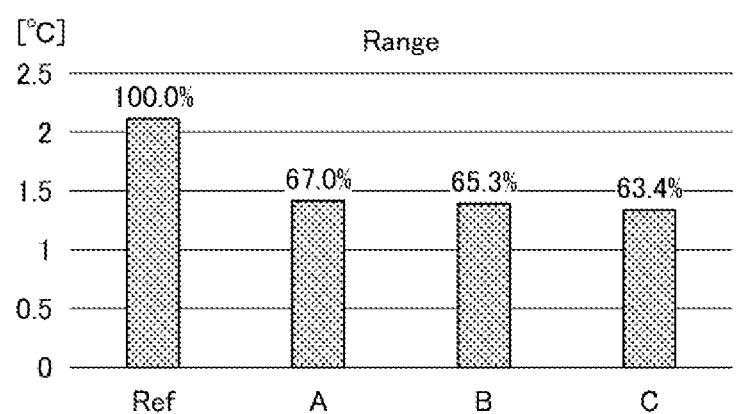
FIGS. 6A and 6B are views showing simulation results.
Figure 6B:
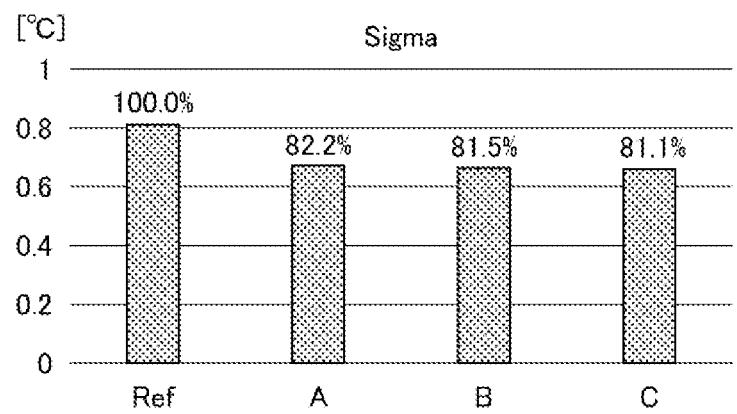

FIG. 6A shows Range values shown in Table 2 with the value for the sample Ref as a reference (100%). FIG. 6B shows Sigma values shown in Table 2 with the value for the sample Ref as a reference (100%).

Based on comparison between the sample Ref and the sample A in FIG. 6A it is understood that the Range value was reduced by about 33% when the base body was made thicker. In addition, based on comparison between the sample Ref with the sample A in FIG. 6B, it is understood that the Sigma value was reduced by about a little less than 20% when the base body was made thicker.

In addition, based on comparison between the sample A and the sample B in FIG. 6A, it is understood that the Range value was slightly improved when the thermal diffusion layers were built in the base body. In addition, based on comparison between the sample A and the sample B in FIG. 6B, it is understood that the Sigma value was slightly improved when the thermal diffusion layers were built in the base body.

In addition, based on comparison between the sample B and the sample C in FIG. 6A, it is understood that the Range value was further improved when the number of the thermal diffusion layers built in the base body was increased. In addition, based on comparison between the sample B and the sample C in FIG. 6B, it is understood that the Sigma value was further improved when the number of the thermal diffusion layers built in the base body was increased.

Thus, it was confirmed that due to an increase in the thickness of the base body, the variation in the temperature distribution in the mounting face of the base body was greatly improved, and due to the thermal diffusion layers built in the base body, the variation in the temperature distribution in the mounting face of the base body was further improved, to thereby improve heat uniformity. Moreover, it was also confirmed that due to an increase in the number of the thermal diffusion layers built in the base body, the variation in the temperature distribution in the mounting face of the base body was further improved, to thereby further improve the heat uniformity.

The preferred embodiment or the like has been described above in detail. However, the present disclosure is not limited to the aforementioned embodiment or the like. Various modifications and substitutions can be made on the aforementioned embodiment or the like without departing from the scope of Claims.

For example, in addition to the semiconductor wafer (such as a silicon wafer), a glass substrate etc. used in a process of manufacturing a liquid crystal panel etc. can be exemplified as the object to be adsorbed by the substrate fixing device according to the present disclosure.

Although the preferred embodiments etc. have been described above in detail, the present disclosure is not limited to the aforementioned embodiments etc., and various modifications and substitutions can be added to the aforementioned embodiments etc. without departing from the scope described in Claims.

What is claimed is:

1. An electrostatic chuck comprising:
a base body formed of a dielectric substance, the base body comprising: a mounting face on which an object to be adsorbed is to be mounted; and a back face that is opposite to the mounting face;
an insulating layer that is formed on the back face;
a heating element that is built in the insulating layer and configured to generate heat;
a plurality of thermal diffusion layers built in the base body and disposed on one another in a thickness direction of the base body, the plurality of thermal diffusion layers being configured to diffuse the heat generated by the heating element, wherein the plurality of thermal diffusion layers are formed of a material higher in thermal conductivity than the base body;
an electrode that is built in the base body; and
a vertical wiring that is built in the base body to be electrically connected to the electrode,
wherein
the vertical wiring comprises a plurality of pads and vias disposed on each other alternately,
the vertical wiring is built in the base body so as to be spaced from the plurality of thermal diffusion layers,
a position of each of the plurality of pads is the same as a position of a corresponding one of the plurality of thermal diffusion layers in the thickness direction, and
each of the plurality of pads is built in the base body so as to be spaced from the corresponding one of the plurality of thermal diffusion layers.

2. The electrostatic chuck according to claim 1, wherein the plurality of thermal diffusion layers surround the vertical wiring in plan view.

3. The electrostatic chuck according to claim 2, wherein each of the plurality of thermal diffusion layers is formed all over the base body except for an area where the vertical wiring is formed in plan view.

4. The electrostatic chuck according to claim 1,
wherein an entire outer circumferential face of the plurality of thermal diffusion layers is exposed in an outer circumferential face of the base body.

5. A substrate fixing device comprising:
a base plate; and
the electrostatic chuck according to claim 1, that is mounted on one face of the base plate.

6. The electrostatic chuck according to claim 1,
wherein the plurality thermal diffusion layers is built in the base body so as to be
disposed between the mounting face and the back face in the thickness direction of the base body, and
spaced from the mounting face and the back face in the thickness direction of the base body.

7. The electrostatic chuck according to claim 1,
wherein the base body consists of the dielectric substance and the plurality of thermal diffusion layers is built in the base body so as to be
disposed between the mounting face and the back face in the thickness direction of the base body, and
spaced from the mounting face and the back face in the thickness direction of the base body.

8. An electrostatic chuck comprising:
a base body formed of a dielectric substance, the base body comprising: a mounting face on which an object to be adsorbed is to be mounted; and a back face that is opposite to the mounting face;
an insulating layer that is formed on the back face;
a heating element that is built in the insulating layer and configured to generate heat;
a plurality of thermal diffusion layers built in the base body and disposed on one another in a thickness direction of the base body, the plurality of thermal diffusion layers being configured to diffuse the heat generated by the heating element, wherein the plurality of thermal diffusion layers are formed of a material higher in thermal conductivity than the base body;
an electrode that is built in the base body; and
a vertical wiring that is built in the base body to be electrically connected to the electrode,
wherein
the vertical wiring comprises a plurality of pads and vias disposed on each other alternately,
the vertical wiring is built in the base body so as to be spaced from the plurality of thermal diffusion layers, and
a distance between one of the plurality of pads which is positioned at a lowermost layer and the back face is longer than a distance between a lowermost one of the plurality of thermal diffusion layers and the back face in the thickness direction.

9. The electrostatic chuck according to claim 8, wherein
a distance between an uppermost one of the plurality of thermal diffusion layers and the mounting face is longer than a distance between a lowermost one of the plurality of thermal diffusion layers and the back face in the thickness direction.

10. A substrate fixing device comprising:
a base plate; and
the electrostatic chuck according to claim 8, that is mounted on one face of the base plate.

11. An electrostatic chuck comprising:
a base body formed of a dielectric substance, the base body comprising: a mounting face on which an object to be adsorbed is to be mounted; and a back face that is opposite to the mounting face;
an insulating layer that is formed on the back face;
a heating element that is built in the insulating layer and configured to generate heat;
a plurality of thermal diffusion layers built in the base body and disposed on one another in a thickness direction of the base body, the plurality of thermal diffusion layers being configured to diffuse the heat generated by the heating element, wherein the plurality of thermal diffusion layers are formed of a material higher in thermal conductivity than the base body;
an electrode that is built in the base body; and
a vertical wiring that is built in the base body to be electrically connected to the electrode,
wherein
the vertical wiring comprises a plurality of pads and vias disposed on each other alternately,
the vertical wiring is built in the base body so as to be spaced from the plurality of thermal diffusion layers, and
a distance between one of the plurality of pads which is positioned at a lowermost layer and the back face is equal to a distance between a lowermost one of the plurality of thermal diffusion layers and the back face in the thickness direction.

12. The electrostatic chuck according to claim 11, wherein
the number of layers of the plurality of pads is smaller than the number of the plurality of thermal diffusion layers.

13. The electrostatic chuck according to claim 11, wherein
a distance between an uppermost one of the plurality of thermal diffusion layers and the mounting face is shorter than a distance between a lowermost one of the plurality of thermal diffusion layers and the back face in the thickness direction.

14. A substrate fixing device comprising:
a base plate; and
the electrostatic chuck according to claim 11, that is mounted on one face of the base plate.

* * * * *